US 8,108,820 B2

(12) United States Patent
Aguado Granados et al.

(10) Patent No.: US 8,108,820 B2
(45) Date of Patent: Jan. 31, 2012

(54) ENHANCED CONDUCTIVITY IN AN AIRGAPPED INTEGRATED CIRCUIT

(75) Inventors: Axel Aguado Granados, Rochester, MN (US); Benjamin Aaron Fox, Rochester, MN (US); Nathaniel James Gibbs, Rochester, MN (US); Andrew Benson Maki, Rochester, MN (US); Trevor Joseph Timpane, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 650 days.

(21) Appl. No.: 12/208,548

(22) Filed: Sep. 11, 2008

(65) Prior Publication Data
US 2010/0063781 A1    Mar. 11, 2010

(51) Int. Cl.
*G06F 17/50* (2006.01)
(52) U.S. Cl. ......... 716/130; 716/110; 716/126; 716/132
(58) Field of Classification Search .................. 716/110, 716/126, 130, 132
See application file for complete search history.

(56) References Cited

U.S. PATENT DOCUMENTS

| | | | |
|---|---|---|---|
| 4,831,495 A * | 5/1989 | Harding | 361/704 |
| 6,316,347 B1 | 11/2001 | Chang et al. | |
| 6,440,839 B1 * | 8/2002 | Partovi et al. | 438/619 |
| 6,492,245 B1 * | 12/2002 | Liu et al. | 438/422 |
| 6,542,371 B1 | 4/2003 | Webb | |
| 6,780,753 B2 | 8/2004 | Latchford et al. | |
| 6,802,047 B1 * | 10/2004 | Doniger | 716/109 |
| 6,971,082 B2 * | 11/2005 | Shiratori | 716/115 |
| 6,989,312 B2 * | 1/2006 | Song et al. | 438/390 |
| 7,078,352 B2 | 7/2006 | Beyer et al. | |
| 7,089,129 B2 * | 8/2006 | Habitz | 702/65 |
| 7,096,450 B2 * | 8/2006 | Gill et al. | 716/115 |
| 7,253,095 B2 | 8/2007 | Lur et al. | |
| 7,413,815 B2 * | 8/2008 | Pramanik | 428/621 |
| 7,698,671 B2 * | 4/2010 | Fujii et al. | 716/106 |
| 7,793,236 B2 * | 9/2010 | Kosowsky et al. | 716/132 |
| 2002/0016058 A1 * | 2/2002 | Zhao | 438/619 |
| 2002/0163082 A1 * | 11/2002 | Lee et al. | 257/758 |
| 2004/0097013 A1 * | 5/2004 | Lur et al. | 438/118 |
| 2004/0119134 A1 * | 6/2004 | Goldberg et al. | 257/508 |
| 2005/0067673 A1 * | 3/2005 | Geffken et al. | 257/573 |
| 2005/0074960 A1 | 4/2005 | Gueneau de Mussy et al. | |
| 2005/0074961 A1 | 4/2005 | Beyer et al. | |
| 2005/0263896 A1 * | 12/2005 | Lur et al. | 257/758 |
| 2006/0190846 A1 | 4/2006 | Hichri et al. | |
| 2006/0249837 A1 * | 11/2006 | Farrar et al. | 257/715 |
| 2008/0048314 A1 * | 2/2008 | Farrar et al. | 257/713 |
| 2008/0097641 A1 * | 4/2008 | Miyashita et al. | 700/121 |
| 2009/0031264 A1 * | 1/2009 | Rittman et al. | 716/5 |
| 2009/0072409 A1 | 3/2009 | Nitta et al. | |
| 2009/0113373 A1 * | 4/2009 | Fukuda | 716/13 |
| 2009/0115061 A1 * | 5/2009 | Chen | 257/751 |

(Continued)

OTHER PUBLICATIONS

U.S. Appl. No. 12/208,469, Non-Final Office Action dated Jan. 18, 2011, (10 pgs).

*Primary Examiner* — Stacy Whitmore
(74) *Attorney, Agent, or Firm* — Toler Law Group (57) ABSTRACT

A method, program product and apparatus include extending lengths that project from a microchip trace into dielectric material. The extending lengths may not connect to another trace. Placement of the extending lengths may be optimized to increase the dissipation of heat from the trace, while maintaining an acceptable level of capacitance.

20 Claims, 6 Drawing Sheets

U.S. PATENT DOCUMENTS

| | | | |
|---|---|---|---|
| 2009/0199149 A1* | 8/2009 | Kwong | 716/15 |
| 2009/0243108 A1 | 10/2009 | Gosset et al. | |
| 2009/0255715 A1* | 10/2009 | Dangler et al. | 174/251 |
| 2009/0298256 A1* | 12/2009 | Chen et al. | 438/421 |
| 2010/0063781 A1 | 3/2010 | Aguado Granados et al. | |
| 2010/0131907 A1* | 5/2010 | Weis | 716/4 |
| 2010/0140753 A1* | 6/2010 | Hembree | 257/621 |

\* cited by examiner

ENHANCED CONDUCTIVITY IN AN AIRGAPPED INTEGRATED CIRCUIT

RELATED APPLICATIONS

The present application relates to co-pending U.S. patent application, entitled "Cost-Benefit Optimization for an Airgapped Integrated Circuit" Ser. No. 12/208,548 by the present inventors, Axel Aguado Granados, Nathan Gibbs, Benjamin Fox, Andrew Maki, and Trevor Timpane. The co-pending application is filed concurrently herewith, and is incorporated by reference in its entirety.

FIELD OF THE INVENTION

The present invention relates to semiconductor fabrication technologies, and more particularly, to integrated circuits having airgaps in submicron processes.

BACKGROUND OF THE INVENTION

The semiconductor industry is continuously reducing the dimensions of devices. There is particular interest in minimizing the size of conductive layers in back-end-of-the-line (BEOL) processing. BEOL processing includes a portion of integrated circuit fabrication where the active components (transistors, resistors, etc.) are interconnected with wiring on a wafer. The BEOL process generally begins when the first layer of metal is deposited on the wafer. It includes contacts, insulators, metal levels, and bonding sites for chip-to-package connections.

With achievement of finer semiconductor processes, the integration and concentration of circuits in a microchip has significantly increased. While such advances provide greater capabilities, the more compact integration also narrows the spacing between circuit wires, or traces. This narrowing can increase parasitic capacitance between traces. Parasitic capacitance occurs when two adjacent traces on a microchip draw electrical energy from one another, when this happens, speeds at which data can move throughout the microchip are slowed. The increase in parasitic capacitance between traces can result in crosstalk, where an electric signal leaks between traces. Power consumption may be increased, as may resistance-capacitance time delays between interconnecting traces, or interconnects. Resistance-capacitance time delays can significantly reduce the operating speed of microchips. Such delays can also cause signals to arrive outside of designed timing margins, disrupting microchip performance.

Airgaps were developed in microelectronic fabrication by International Business Machines Corporation (IBM) to address these problems. Airgaps typically comprise vacuumed voids in the silicon dioxide substrate adjacent at least one side of a trace. The airgaps reduce the amount of capacitance between traces in the multilayer design of the microchip. Capacitance can be minimized by insulating copper wires or other conductive traces of a microchip with the vacuumed airgaps.

IBM has developed a way to manufacture airgaps on a massive scale. Such processes may use the self-assembly properties of certain polymers combined with complimentary metal-oxide-semiconductor (CMOS) manufacturing techniques. During semiconductor production, the entire wafer may be prepared with a polymer material. When the polymer material is removed, trillions of selectively positioned airgaps may result. Such exemplary airgaps may be around 20 nanometers in diameter and evenly spaced.

The airgaps have a lower dielectric constant than silicon dioxide. The extremely low dielectric constant of air, i.e., "1," makes it an ideal dielectric medium for lowering the capacitance between the narrow trace configurations. The reduced capacitance of the airgap functions to increase timing margins, as well as frequency targets. The minimization of the capacitance enables microchips to work faster and draw less power.

Despite their benefits, airgaps introduce their own challenges to microchip design. For example, airgaps have relatively low thermal conductive attributes. The conductivity of airgaps is lower than that of the conventional silicon based material surrounding traces. As such, the thermal conductivity associated with airgaps and the trace portions they border is low when compared to that of traces without airgaps. As the wires traces become hot, this decrease in thermal conductivity hinders the dissipation of heat. The poor heat flow associated with airgaps consequently causes heat to become trapped in the airgaps. That is, the poor thermal conductivity of the air or vacuumed space of the airgaps often results in a rapid rise in temperature. The increased heat will decrease the time to end-of-life failures like electromigration, thus degrading the microchip's performance. Electromigration is the transport of material caused by the gradual movement of the ions in a conductor due to the momentum transfer between conducting electrons and diffusing metal atoms.

These problems associated with incorporating airgaps into the fabrication process may discourage their use. Such a reluctance may translate into the potential performance benefits of airgaps being unrealized.

A need consequently exists for an improved manner of designing and fabricating airgaps in a microchip.

SUMMARY OF THE INVENTION

The present invention provides an improved computer implemented method, apparatus and program product for designing and improving the performance of a microchip. Aspects of the invention may selectively include within a microchip design a conductive length extending from a trace into a dielectric material to optimally increase a conductive property while regulating a capacitive property associated with the microchip design. Embodiments may additionally output the microchip design for implementation.

According to an aspect of the invention, the capacitive property may be maintained below an unacceptable limit. Optimally increasing the conductive property may further comprise increasing heat conduction. Another or the same embodiment may increase current flow, e.g., a root mean square of current.

Embodiments consistent with the present invention may further determine an optimal number, as well as an optimal position of a plurality of additional conductive lengths for inclusion within the microchip based upon the conductive and capacitive properties.

Selectively including the conductive length may extend to configuring the conductive length to be unconnected to another trace. A relative density of a plurality of traces proximate the trace may also be determined. The conductive length may be added proximate a relatively low density region of a plurality of traces proximate the trace. Where appropriate, another conductive length may be added to a next lower density region of the plurality of the traces proximate the trace.

Selectively including the conductive length further comprises determining the conductive property with the conductive length, and without the conductive length in the microchip design. A difference in respective conductive properties with the conductive length present and with the conductive length absent may also be determined. Selectively including the conductive length to the trace further comprises determining if a desired current level is achieved. The computer implemented method may also determine if an acceptable capacitance is achieved, and/or that a capacitance limit remains unmet. Aspects of the invention may further comprise including the conductive length within the microchip.

Embodiments consistent with the invention may comprise a memory, program code residing in the memory, and a processor in communication with the memory and configured to execute the program code to selectively include within a microchip design a conductive length extending from a trace into a dielectric material. Embodiments may increase a conductive property while regulating a capacitive property associated with the microchip design. Aspects of the invention may output the microchip design.

Embodiments consistent with the invention may comprise a program product comprising program code configured to selectively include within a microchip design a conductive length extending from a trace into a dielectric material. Aspects may increase a conductive property while regulating a capacitive property associated with the microchip design. The program product may output the microchip design. The program product may further comprise a computer readable medium bearing the program code.

These and other advantages and features that characterize the invention are set forth in the claims annexed hereto and forming a further part hereof. However, for a better understanding of the invention, and of the advantages and objectives attained through its use, reference should be made to the Drawings and to the accompanying descriptive matter in which there are described exemplary embodiments of the invention.

DETAILED DESCRIPTION

Embodiments consistent with the underlying principle of the present invention may comprise including extending lengths that project from a microchip trace into dielectric material. The extending lengths may not connect to another trace. Placement of the extending lengths may be optimized to increase the dissipation of heat from the trace, while maintaining an acceptable level of capacitance.

Embodiments consistent with the underlying principles of the present invention may improve the maximum root mean square current ($I_{rms}$) away from airgapped wires to enhance BEOL airgap technology. The $I_{rms}$, also known as the quadratic mean, is a statistical measure of the magnitude of varying current.

Aspects of the invention may include a post processing method and algorithm that adds extending lengths around an airgapped trace. The lengths, which may also be referred to herein as false vias or stubs, may be positioned above and below an airgapped trace to improve the "maximum $I_{rms}$ from self" of the trace. The extending lengths may not connect to anything but the dielectric on the adjacent layers above and below. The extending lengths may provide more surface area between the wire trace and the dielectric for the dissipation of heat.

Aspects of the invention may use the amount of capacitance added to the wire trace to determine the extending length density per trace. Program code may add stubs/extending lengths into areas of low wiring density around the trace such that the added parasitic capacitance is minimized. Such processes may be used where adding in incremental amounts of capacitance to a wire is adequate in order to increase the maximum $I_{rms}$ of a wire.

Aspects of the invention may address issues associated with the maximum $I_{rms}$ of a trace being decreased when co-planar airgaps are added to a trace. The maximum $I_{rms}$ decreases since there is less surface area between the wire and the dielectric, which decreases the amount of heat dissipated from the wire. Embodiments may add extending lengths, or antenna stubs, to the trace such that the lengths extend into the dielectric above and below. The extensions increase the surface area between the wire and dielectric, and thus increase the maximum $I_{rms}$ capabilities of the trace.

Embodiments consistent with the underlying principles of the invention may add stub-like vias/extending lengths above and below the trace of interest. The extending lengths may not connect to anything and may act as heat sinks to increase the surface area between the wire and the dielectric. The extending lengths may be added in a post processing stage such that an optimal length placement along the trace may be determined. This optimization may minimize any parasitic capacitance associated with adding the extending lengths.

Embodiments may perform modeling to analyze the parasitic capacitance associated with adding various numbers of extensions to the trace. Different wiring densities around the trace of concern may be analyzed to optimally and initially add extensions where the wiring density is low.

Optimized processes consistent with the invention may add as many extending lengths as is possible without dramatically increasing the capacitance on a trace. Embodiments may add airgaps to the BEOL of the microchip design as a post-processing step. Aspects of the invention may automatically determine the amount and location for including stubs above and below traces. The inclusion may be accomplished in a manner that may keep the added parasitic capacitance to a minimum, while improving the maximum $I_{rms}$ of the wires.

Embodiments consistent with the invention may analyze an area directly above and below the path of a trace to identify preferred locations for adding extending lengths. That is, processes may place extending lengths such that they will not cause shorts and may provide the best locations based on lowest parasitic capacitance. The number of extending lengths may be limited by an acceptable increase in parasitic capacitance. As discussed below, processes may be repeated for all traces of interest. The extensions may conform to standard DRC requirements.

Figure 1:
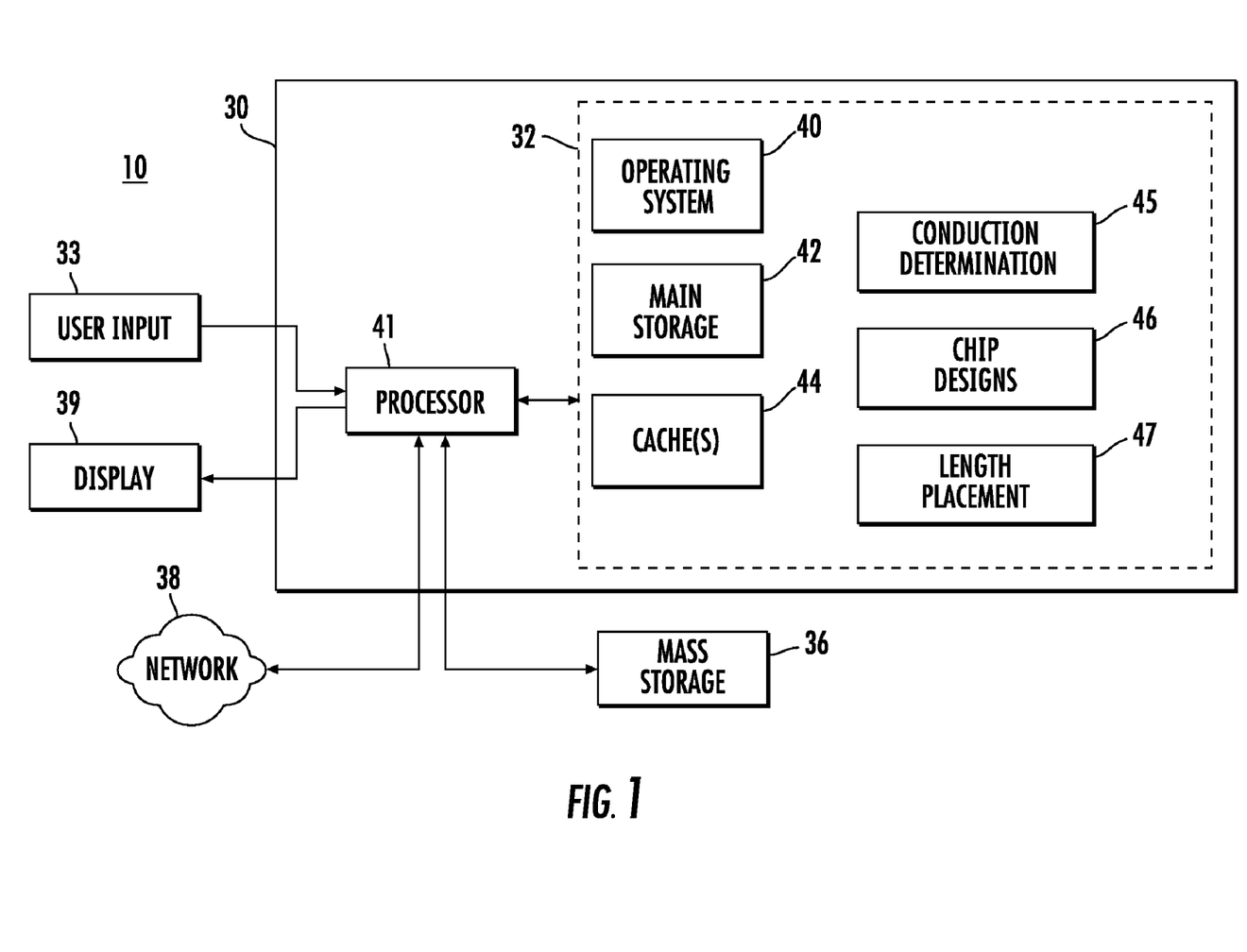
FIG. 1 shows a block diagram of a networked computer system configured to determine the optimal placement of extending lengths of a trace to increase conductivity associated with an airgap within a microchip design in accordance with the principles of the present invention.

While the principles of this invention do not limit its forum or application, one embodiment capitalizes on the structure available through the system exemplified in FIG. 1. FIG. 1 generally shows a block diagram of a networked computer device, or system 10, configured to determine the optimal placement of extending lengths of a trace to increase thermal conductivity associated with an airgap within a microchip design in accordance with the principles of the present invention. The system 10 more particularly comprises one or more client computer(s) 30 coupled to a network 38. Network 38 represents a networked interconnection, including, but not limited to local area, wide area, wireless, and public networks (e.g., the Internet). Moreover, any number of computers and other devices may be networked through network 38, e.g., multiple servers.

Computer system 10 will hereinafter also be referred to as an "apparatus," "computer," "tool," "device," or "system," although it should be appreciated that the terms may respectively include many other controller configurations. Moreover, while only one network interface device is shown in FIG. 1, any number of computers and other devices may be networked through network 38. In still another embodiment, the system 10 may be implemented in a standalone configuration, i.e., disconnected from another computer or computer network.

Computer device 30 typically includes at least one processor 41 coupled to a memory 32. Processor 41 may represent one or more processors (e.g., central processing units, microprocessors). Memory 32 may represent the SRAM devices comprising the main storage 42 of computer device 30, as well as any supplemental levels of memory, e.g., cache memories, non-volatile or backup memories (e.g., programmable or flash memories), read-only memories, etc. In addition, memory 32 may be considered to include memory storage physically located elsewhere in computer device 30, e.g., any cache memory present in processor 41, as well as any storage capacity used as a virtual memory, e.g., as stored within a database 37, or on another computer coupled to computer device 30 via network 38.

Computer device 30 also may receive a number of inputs and outputs for communicating information externally. For interface with a user, computer device 30 typically includes one or more input devices 33 (e.g., a keyboard, a mouse, a trackball, a joystick, a touch pad, iris/fingerprint scanner, and/or a microphone, among others). The computer device 30 additionally includes a display 39 (e.g., a CRT monitor, an LCD display panel, and/or a speaker, among others). It should be appreciated, however, that with some implementations of the computer device 30, direct user input and output may be unsupported by the computer, and interface with the server computer device 30 may be implemented through a computer or workstation networked with the computer device 30.

For additional storage, computer device 30 may also include one or more mass storage devices 36 configured to store, for instance, the database 37. Exemplary devices 36 can include: a floppy or other removable disk drive, a flash drive, a hard disk drive, a direct access storage device (DASD), an optical drive (e.g., a CD drive, a DVD drive, etc.), and/or a tape drive, among others. Furthermore, computer device 30 may include an interface with one or more networks (e.g., a LAN, a WAN, a wireless network, and/or the Internet, among others) to permit the communication of information with other computers coupled to the network 38. It should be appreciated that computer device 30 typically includes suitable analog and/or digital interfaces between processor 41 and each of components 32, 33, 36, 38 and 39.

Computer device 30 may operate under the control of an operating system 40, and executes various computer software and hardware applications, components, programs, modules, e.g., a main memory storage 42, a cache(s) 44, a conduction determination program 45, a microchip design(s) 46, and an extending length placement program 47. As discussed herein, the conduction determination program 45 may determine the current, thermal or other conductivity associated with the airgaps. The extending length placement program 47 may determine and facilitate the optimal placement of the extending lengths within the microchip design 46.

Various applications, components, programs, markers, modules, etc. may also execute and/or be stored on one or more processors and/or memory/caches of another computer coupled to computer device 30 via a network 38, e.g., in a distributed or client-server computing environment, whereby the processing required to implement the functions of a computer program may be allocated to multiple computers over a network. Moreover, while computer device 30 may include a networked computer device, other embodiments of the device 30 may include relatively smaller and more focused computing applications or components, such as a cellular phone, a PDA or a microchip.

In general, the routines executed to implement the embodiments of the invention, whether implemented in hardware, as part of an operating system, or as a specific application, component, program, engine, process, programmatic tool, object, module or sequence of instructions, or even a subset thereof, may be referred to herein as a "algorithm," "function," "program code," or simply "program." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. One of skill in the art should appreciate that embodiments consistent with the principles of the present invention may nonetheless use program code resident at only one or any number of locations.

Moreover, while the invention has and hereinafter will be described in the context of fully functioning computer systems, those skilled in the art will appreciate that the various embodiments of the invention are capable of being distributed as a program product in a variety of forms, and that the invention applies equally regardless of the particular type of computer readable, signal bearing media used to actually carry out the distribution. Examples of signal bearing, computer readable media include, but are not limited to tangible, recordable type media such as volatile and non-volatile memory devices, floppy and other removable disks, hard disk drives, magnetic tape, optical disks (e.g., CD ROMs, DVDs, etc.), among others, and transmission type media such as digital and analog communication links.

In addition, various program code described hereinafter may be identified based upon the application or engine within which it is implemented in a specific embodiment of the invention. However, it should be appreciated that any particular program nomenclature that follows is used merely for convenience, and thus the invention should not be limited to use solely in any specific application or engine identified and/or implied by such nomenclature.

Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

The various software components and resources illustrated in FIG. 1 may be implemented in a number of manners, including using various computer software applications, routines, components, programs, objects, modules, data structures and programs. Those skilled in the art will further recognize that the exemplary environments illustrated in FIG. 1 are not intended to limit the present invention. Indeed, those skilled in the art will recognize that other alternative hardware and/or software environments may be used without departing from the scope of the invention.

Figure 2:
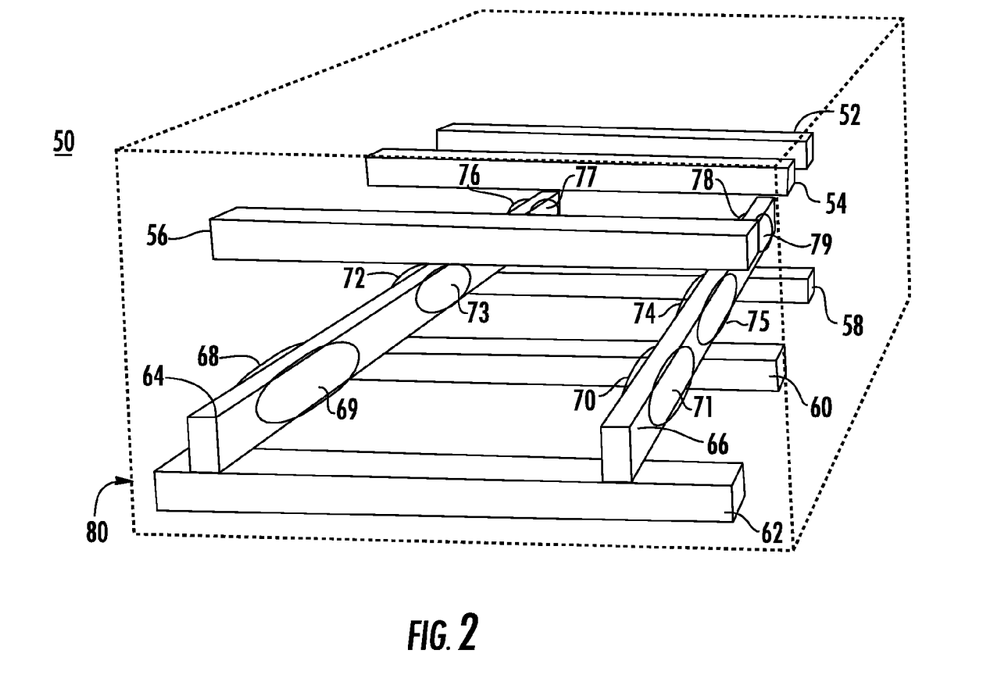
FIG. 2 shows a microchip, including a number of traces or wires, included within a silicon based or other dielectric material and suited for receiving extending lengths in accordance with the principles of the present invention.

FIG. 2 shows a microchip 50 including a number of traces 52, 54, 56, 58, 60, 62, 64, 66, or wires, included within a silicon based or other dielectric material 80 and suited for receiving extending lengths in accordance with the principles of the present invention. The microchip 50 shown in FIG. 2 includes airgaps 68, 69, 70, 71, 72, 73, 74, 75, 76, 77, 78, 79. The airgaps 68, 69, 70, 71, 72, 73, 74, 75, 76, 77, 78, 79 typically comprise vacuum spaces, but may alternatively contain air. As discussed herein, the airgaps 68, 69, 70, 71, 72, 73, 74, 75, 76, 77, 78, 79 may function to reduce capacitance, but also impair the ability of the microchip 50 to eliminate heat around the traces 64, 66.

Figure 3:
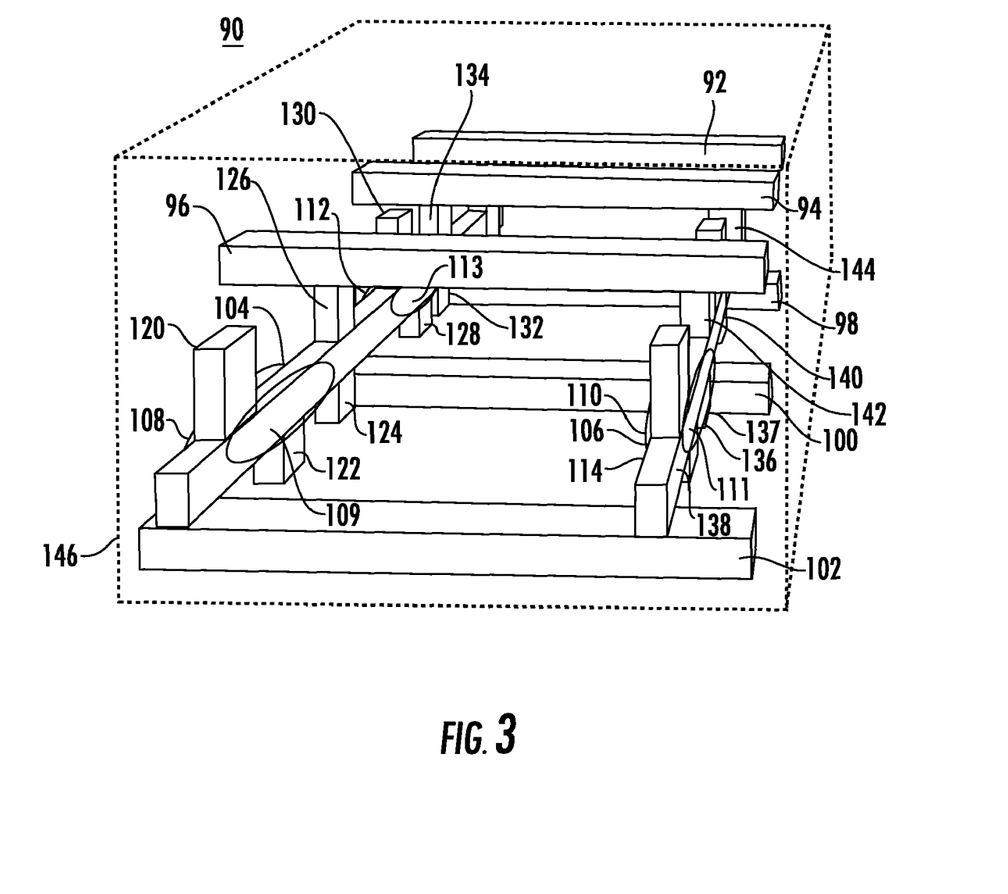
FIG. 3 shows a microchip including a number of traces having associated extending lengths in accordance with the underlying principles of the present invention.

FIG. 3 shows a microchip 90 including a number of traces 92, 94, 96, 98, 100, 102, 104, 106 having associated extending lengths 120, 122, 124, 126, 128, 130, 132, 134, 136, 137, 138, 140, 142, 144 in accordance with the underlying principles of the present invention. The traces 92, 94, 96, 98, 100, 102, 104, 106 are shown suspended in a silicon substrate or other dielectric 146. The dielectric material for purposes of embodiments consistent with the underlying principles of the present invention may include a substance having greater conductive attributes than air or a vacuum of an airgap. Airgaps 108, 109, 110, 111, 112, 113 are shown positioned around two of the traces 104, 106. These traces, 104, 106 include extending lengths 120, 122, 124, 126, 128, 130, 132, 134, 136, 137, 138, 140, 142, 144.

The extending lengths 120, 122, 124, 126, 128, 130, 132, 134, 136, 137, 138, 140, 142, 144 extend from the main axis of the traces 104, 106 into the silicon based dielectric material 146. As such, the surface area of the wire contacting the dielectric, silicon based material 146 is increased. The extending lengths 120, 122, 124, 126, 128, 130, 132, 134, 136, 137, 138, 140, 142, 144 thus serve to increase the thermal conduction properties associated with the traces 104, 106 and the microchip. That is, the extending lengths 120, 122, 124, 126, 128, 130, 132, 134, 136, 137, 138, 140, 142, 144 may increase the dissipation of heat.

Figure 4:
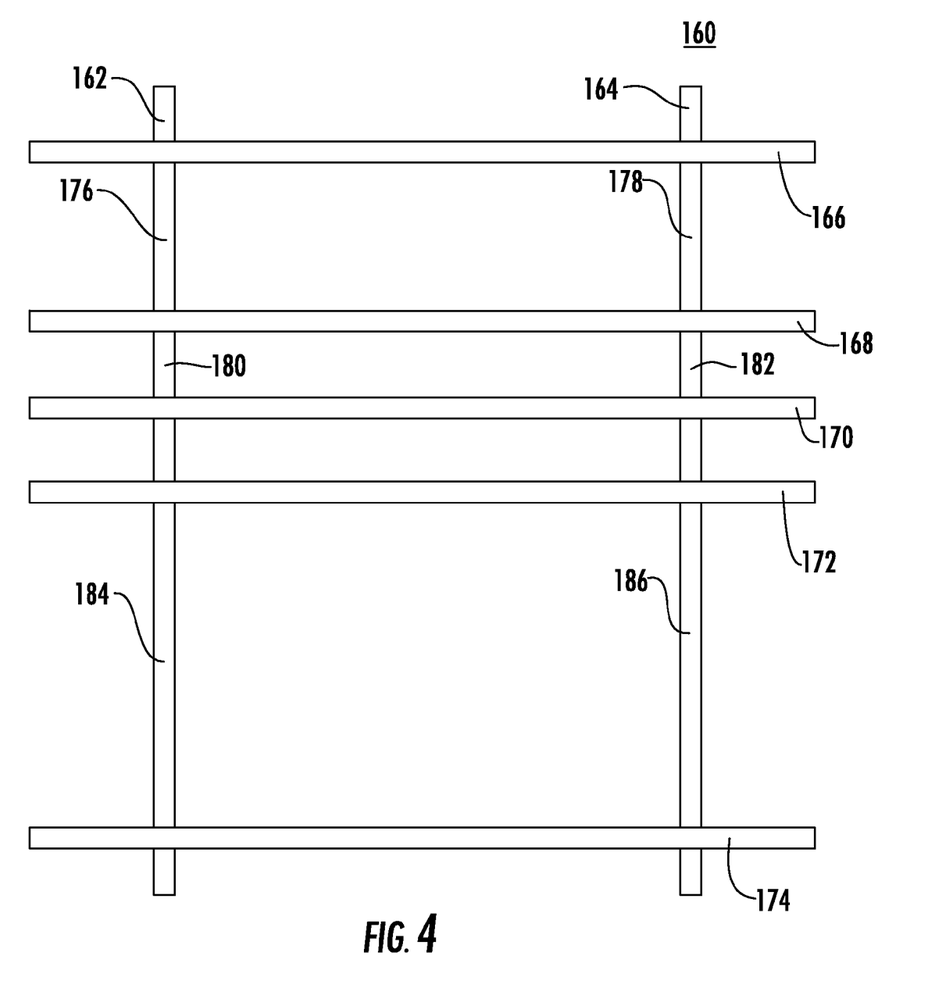
FIG. 4 shows a top view of a system of traces suited to receive extending lengths in accordance with the underlying principles of the present invention.

FIG. 4 shows a top view of a system 160 of traces 162, 164, 166, 168, 170, 172, 174 suited to receive extending lengths in accordance with the underlying principles of the present invention. From this perspective, it is apparent that certain areas of the traces 162, 164 include areas having relatively different wiring densities. For example, the wiring density at points 184, 186 is less than at points 180, 182. That is, points 184, 186 of the traces 162, 164, respectively, are relatively further away from proximate traces 172, 174. Points 180, 182 are relatively closer to proximate traces 168, 170. The wiring densities at points 176, 178 of respective traces 162, 164 are relatively in between the wiring densities at points 180, 182 and at points 184, 186. Program code consistent with the underlying embodiments of the present invention may initially add extending lengths to areas, such as points 184, 186, that include lower wire densities. This feature may minimize additional capacitance associated with the airgaps.

As will be appreciated by one of skill in the art, the traces for purposes of this specification may include a circuit or portion of a circuit. The microchip may include multiple levels of metal, transistors, capacitors, or other devices, including integrated airgap structures built according to known methods. Such airgaps may be positioned adjacent at least one side of the trace of the microchip.

Similarly, as used herein, the terms "on" or "onto" or "above" when used in connection with various airgap, extending length and/or trace positions are merely intended to denote a physical spatial relationship, and not necessarily a direct physical or electrical contact. It will be understood therefore by those skilled in the art that in embodiments of the invention, a first layer may be "on" or "above" a second layer, even if there are other intervening layers present.

The program code may add extending lengths 120, 122, 124, 126, 128, 130, 132, 134, 136, 137, 138, 140, 142, 144 to areas, such as at points 176, 178 of respective traces 162, 164 having a relatively higher density (and, consequently, a relatively lower priority).

The program code may add extending lengths lastly to those areas 180, 182 having the relatively lowest priority and highest wiring density. Put another way, program code consistent with the invention may locate all the priority 1 locations 184, 186 as shown in FIG. 4. Extending lengths may be added to such locations 184, 186 before others such that wire capacitance is kept to a minimum. If this action does not result in enough extending lengths to achieve the $I_{rms}$ target and the wire capacitance is below an acceptable value, aspects of the invention may add extending lengths to the priority 2 areas. Such prioritized placements may continue until either the acceptable $I_{rms}$ or maximum wire capacitance is met.

Figure 5:
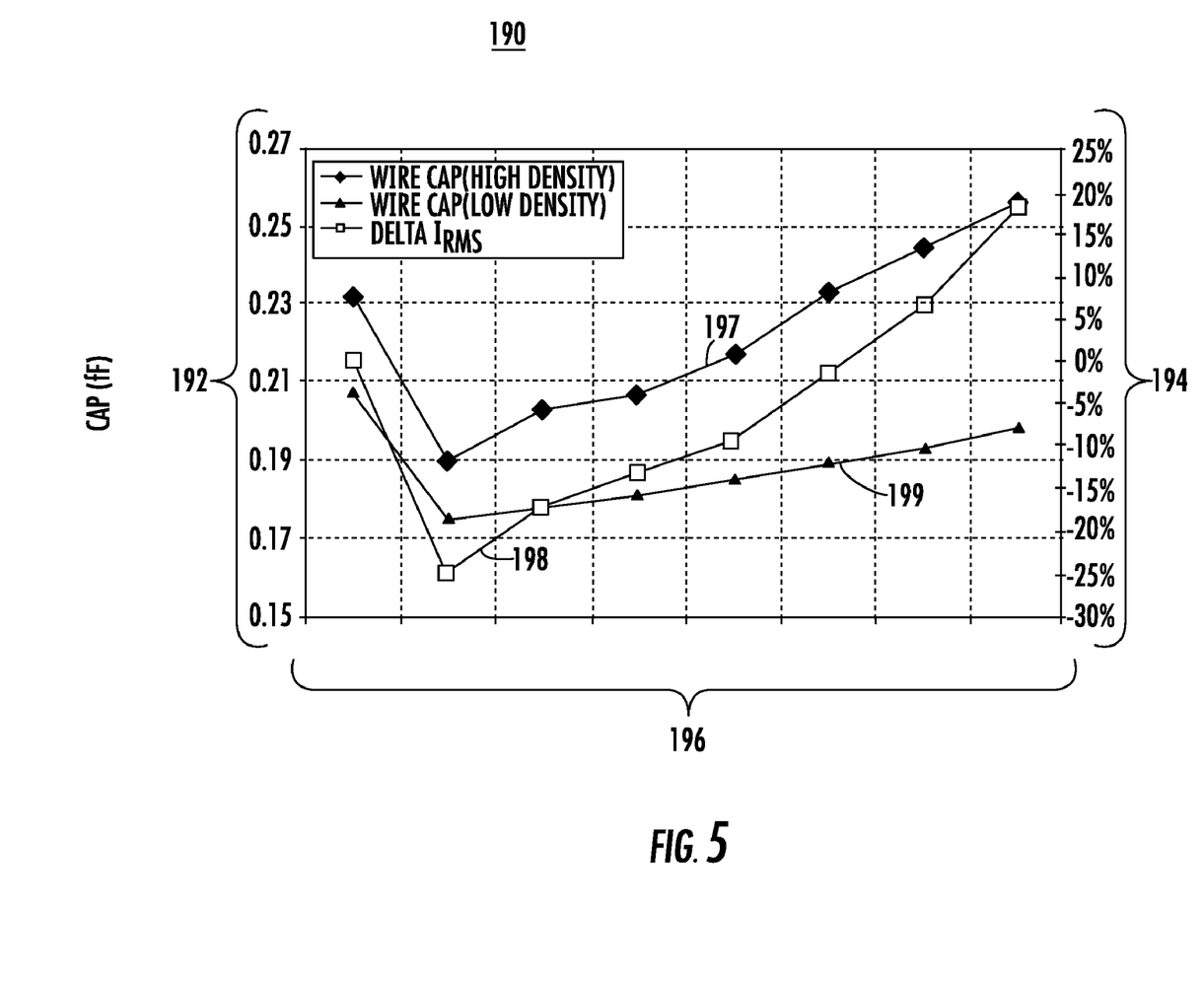
FIG. 5 shows a graph that charts capacitance values and current values as extending lengths are added to a microchip design in accordance with the underlying principles of the present invention.

FIG. 5 shows a graph 190 that charts capacitance values 192 and current values 194 as extending lengths are added to a microchip design 46 in accordance with the underlying principles of the present invention. The portion 196 of the graph 190 along the x-axis plots the capacitance and conduction properties relative to differing combinations of airgaps and extending lengths. For instance, the capacitance and current may be analyzed with no airgaps and no extending lengths. At this point, the current may be normalized to 0%.

Line 197 represents plotted values in the chart 190 of capacitance in a relatively high density area. Line 198 represents capacitance values in a relatively low density area. Line 199 represents a relative change in $I_{rms}$.

Airgaps may be added to the microchip design 46, which reduces capacitance. However, the delta $I_{rms}$ also decreases. The subsequent addition of extending lengths serves to increase the delta $I_{rms}$ as shown in line 199 while maintaining an acceptable capacitance. Designers may specify a target $I_{rms}$ and an acceptable additional wire capacitance to determine optimal extending length placement, e.g., number and position.

Capacitance generally decreases as airgaps are added to the trace. A negative delta $I_{rms}$ will occur with the removal of dielectric from around the trace. Improvement in the $I_{rms}$ is evident as extending lengths are added to the trace. Wire capacitance may also increase. Six extending lengths may be required to get the maximum $I_{rms}$ of the trace back to the original $I_{rms}$ value, i.e., when no airgaps were present. If all the extending lengths are added in high density locations, as demonstrated in line 197, then overall wire capacitance may increase to be the same as when no airgaps are present. Such a scenario may result in the airgaps not being worth the money. Should airgaps alternatively be intelligently placed in the low wire density region, the wire capacitance is increased by a lesser, acceptable amount, as depicted in line 198. Such a scenario may make the addition of airgaps worth the money. Therefore, the advantage of adding airgaps (lower wire capacitance) is still present, but the disadvantage (lower $I_{rms}$) is mitigated.

Figure 6:
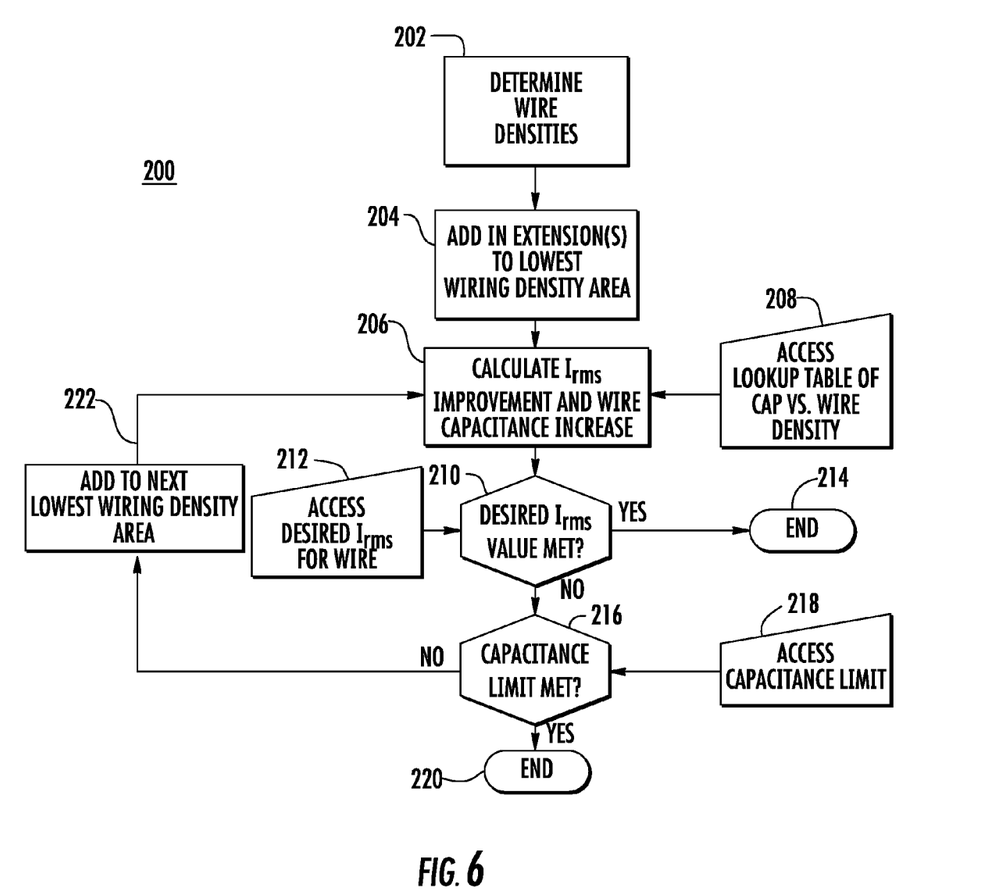
FIG. 6 shows a flowchart having steps executable by the system of FIG. 1 for including within a microchip extending lengths for enhancing conductive properties of the microchip.

FIG. 6 shows a flowchart 200 having steps executable by the system 10 of FIG. 1 for including within a microchip extending lengths for enhancing conductive properties of the microchip. At block 202, embodiments may consider the path of the trace and its associated conductive and capacitive properties. These properties may be considered above, below and on the same plane as the trace 162, 164, 166, 168, 170, 172, 174. Extending lengths 120, 122, 124, 126, 128, 130, 132, 134, 136, 137, 138, 140, 142, 144 may be added at block 204 to an area 184 having relatively the lowest wiring density.

Program code consistent with the invention may determine at block 206 an $I_{rms}$ improvement and any increase in capacitance. This may be facilitated at block 208 by embodiments accessing a lookup table of extending length capacitance versus wire density.

The system 10 may determine at block 210 if the desired $I_{rms}$ value has been met. As such, the system 10 may retrieve at block 212 the desired $I_{rms}$ from memory 32. If the $I_{rms}$ value is met at block 210, the process may end at block 214.

Where the desired $I_{rms}$ is alternatively unmet at block 210, then embodiments may determine at block 216 if a capacitance limit has been met. This step may be facilitated at block 218 by accessing the wire capacitance limit from memory. If so, the system 10 may conclude processes at block 220.

Where the wire capacitance limit is unmet at block 216, embodiments may add additional extending length(s) at block 222 to a next lowest wiring density area 176. The system 10 may then determine again the applicable $I_{rms}$ improvement and trace capacitance increase.

While the present invention has been illustrated by a description of various embodiments and while these embodiments have been described in considerable detail, it is not the intention of the Applicants to restrict, or, in any way limit the scope of the appended claims to such detail. For instance, while extending lengths are useful with airgaps, they may be equally applicable in other embodiments involving no airgaps, but with a desire to improve conductivity. The underlying principles of the present invention may furthermore apply to airgap integration into VLSI applications. The invention in its broader aspects is therefore not limited to the specific details, representative apparatus and method, and illustrative example shown and described. Accordingly, departures may be made from such details without departing from the spirit or scope of Applicants' general inventive concept.

What is claimed is:

1. A computer implemented method of designing a microchip, the computer implemented method comprising:
   adding an airgap to a microchip design file stored within a memory;
   automatically locating a trace proximate the airgap;
   adding a conductive length extending from the trace into a dielectric material to optimally increase a conductive property while regulating a capacitive property associated with the microchip design file; and
   outputting the microchip design file.

2. The computer implemented method of claim 1, wherein selectively including the conductive length further comprises configuring the conductive length to be unconnected to another trace.

3. The computer implemented method of claim 1, wherein regulating the capacitive property further comprises maintaining the capacitive property be an undesirable value.

4. The computer implemented method of claim 1, wherein optimally increasing the conductive property further comprises increasing heat conduction.

5. The computer implemented method of claim 1, wherein optimally increasing the conductive property further comprises increasing a root mean square of current.

6. The computer implemented method of claim 1, wherein optimally increasing the conductive property further comprises increasing current flow.

7. The computer implemented method of claim 1, further comprising determining an optimal number of a plurality of additional conductive lengths for inclusion within the microchip design file based upon the conductive and capacitive properties.

8. The computer implemented method of claim 1, further comprising determining an optimal position for a plurality of additional conductive lengths based upon the conductive and capacitive properties.

9. The computer implemented method of claim 1, further comprising determining a relative density of a plurality of traces proximate the trace.

10. The computer implemented method of claim 1, further comprising selectively including the conductive length proximate a relatively low density region of a plurality of traces proximate the trace.

11. The computer implemented method of claim 10, further comprising including another conductive length proximate a next lower density region of the plurality of the traces proximate the trace.

12. The computer implemented method of claim 1, further comprising determining the conductive property without the conductive length in the microchip design file.

13. The computer implemented method of claim 1, further comprising determining the conductive property with the conductive length in the microchip design file.

14. The computer implemented method of claim 1, further comprising determining a difference in conduction with the conductive length present and with the conductive length absent.

15. The computer implemented method of claim 1, further comprising determining if a desired current level is achieved.

16. The computer implemented method of claim 1, further comprising determining if an acceptable capacitance is achieved.

17. The computer implemented method of claim 16, further comprising determining that a capacitance limit remains unmet.

18. The computer implemented method of claim 1, further comprising including the conductive length within the microchip design file.

19. An apparatus, comprising:
   a memory;
   program code residing in the memory; and
   a processor in communication with the memory and configured to execute the program code to add an airgap to a microchip design file stored within the memory, to locate a trace proximate the airgap, to add a conductive length extending from a trace into a dielectric material to optimally increase a conductive property while regulating a capacitive property associated with the microchip design file, and to output the microchip design file.

20. A program product, comprising:
   program code configured to be executed by a processor to add an airgap to a microchip design file stored within a memory, to locate a trace proximate the airgap, to add a conductive length extending from a trace into a dielectric material to optimally increase a conductive property and regulate a capacitive property associated with the microchip design file, and to output the microchip design file; and
   a non-transitory computer readable medium bearing the program code.

* * * * *